(12) United States Patent
Du et al.

(10) Patent No.: US 11,005,083 B2
(45) Date of Patent: May 11, 2021

(54) HIGH-RESOLUTION MICRO-OLED DISPLAY MODULE AND MANUFACTURING METHOD THEREOF

(71) Applicant: SUZHOU QINGYUE OPTOELECTRONICS TECHNOLOGY CO., LTD., Kunshan (CN)

(72) Inventors: Xiaosong Du, Kunshan (CN); Xiaolong Yang, Kunshan (CN); Wenbin Zhou, Kunshan (CN); Jian Sun, Kunshan (CN); Yudi Gao, Kunshan (CN)

(73) Assignee: SUZHOU QINGYUE OPTOELECTRONICS TECHNOLOGY CO., LTD, Kunshan (CN)

( * ) Notice: Subject to any disclaimer, the term of this patent is extended or adjusted under 35 U.S.C. 154(b) by 0 days.

(21) Appl. No.: 16/729,456

(22) Filed: Dec. 29, 2019

(65) Prior Publication Data
US 2020/0144557 A1    May 7, 2020

(51) Int. Cl.
*H01L 51/56*    (2006.01)
*H01L 51/52*    (2006.01)
(Continued)

(52) U.S. Cl.
CPC ............ *H01L 51/56* (2013.01); *H01L 27/322* (2013.01); *H01L 27/3246* (2013.01);
(Continued)

(58) Field of Classification Search
CPC .................................................. H01L 51/5271
See application file for complete search history.

(56) References Cited

U.S. PATENT DOCUMENTS

2014/0042480 A1    2/2014   Moon et al.
2017/0317152 A1   11/2017   Hsu
(Continued)

FOREIGN PATENT DOCUMENTS

| CN | 102157653 A | 8/2011 |
| CN | 106449700 A | 2/2017 |

(Continued)

OTHER PUBLICATIONS

First Office Action of Chinese Application No. 201811642103.2.
Second Office Action of Chinese Application No. 201811642103.2.

*Primary Examiner* — Yu-Hsi D Sun
(74) *Attorney, Agent, or Firm* — Kilpatrick Townsend & Stockton

(57) ABSTRACT

The present invention provides a high-resolution Micro-OLED display module and a manufacturing method thereof. The method for manufacturing the high-resolution Micro-OLED comprises: S1, providing a substrate, and manufacturing light-emitting pixel units on the substrate; S2, encapsulating the light-emitting pixel units by a film encapsulation technique, and forming a film encapsulation layer; S3, manufacturing sub-pixel units on the surface of the film encapsulation layer, and depositing a metal reflective layer between two sub-pixel units which are adjacent to each other; S4, manufacturing a metal oxide layer on the surfaces of the metal reflective layer and the sub-pixel units by a deposition technique, to obtain a high-resolution Micro-OLED matrix; and S5, using a cover plate to encapsulate the high-resolution Micro-OLED matrix produced in step S4, to finish the manufacturing of a high-resolution Micro-OLED.

17 Claims, 4 Drawing Sheets

(51) Int. Cl.
    *H01L 51/00*     (2006.01)
    *H01L 27/32*     (2006.01)
    *H01L 51/50*     (2006.01)

(52) U.S. Cl.
    CPC ........ *H01L 27/3248* (2013.01); *H01L 51/001* (2013.01); *H01L 51/0021* (2013.01); *H01L 51/524* (2013.01); *H01L 51/5253* (2013.01); *H01L 51/5271* (2013.01); *H01L 51/5281* (2013.01); *H01L 51/5012* (2013.01); *H01L 51/5206* (2013.01); *H01L 51/5221* (2013.01); *H01L 2227/323* (2013.01); *H01L 2251/301* (2013.01); *H01L 2251/303* (2013.01); *H01L 2251/5369* (2013.01)

(56) References Cited

U.S. PATENT DOCUMENTS

| | | |
|---|---|---|
| 2019/0006627 A1 | 1/2019 | Li et al. |
| 2019/0165326 A1* | 5/2019 | Kim .................... H01L 51/5293 |
| 2020/0028036 A1 | 1/2020 | Bonar et al. |

FOREIGN PATENT DOCUMENTS

| | | |
|---|---|---|
| CN | 107195801 A | 9/2017 |
| CN | 107210315 A | 9/2017 |
| CN | 108257949 A | 7/2018 |
| WO | 2016016461 A1 | 2/2016 |

\* cited by examiner

HIGH-RESOLUTION MICRO-OLED DISPLAY MODULE AND MANUFACTURING METHOD THEREOF

CROSS REFERENCE TO RELATED APPLICATIONS

This application claims priority under 35 U.S.C. § 119 to Chinese Patent Application No. 201811642103.2, filed on Dec. 29, 2018, which is incorporated herein in its entirety.

TECHNICAL FIELD

The present invention relates to a high-resolution Micro-OLED display module and a manufacturing method thereof, belonging to the field of manufacturing of OLED displays.

BACKGROUND

Compared with a CTR (Cathode Ray Tube) display or a TFT-LCD (Thin Film Transistor-Liquid Crystal Display), an OLED (Organic Light-Emitting Diode) display has the characteristics of lighter and thinner appearance design, wider viewing angles, faster response speed and lower power consumption, therefore, as the next-generation display device, the OLED display has gradually attracted more attentions.

In the prior art, an OLED display includes a Micro-OLED device, and the common Micro-OLED devices are affected by precision of an FFM (Fine Metal Mask) technology, such that PPI (Pixels Per Inch) of the Micro-OLED can only reach about 800, and the requirements of a higher PPI cannot be satisfied.

Meanwhile, at present, the full colorization of a Micro-OLED display device is realized by combining a white light OLED with a CF (Color Filter) layer, and a semiconductor photoengraving process is utilized to ensure high refinement of the CF layer, thereby improving resolution of a Micro-OLED display device; however, in the practical application process, since the light transmittance of a CF layer is lower than 30%, optical loss is easily caused to the Micro-OLED in a display process, such that the maximum brightness of the Micro-OLED display device is low; in addition, since the CF layer has a high requirement on counterpoint alignment precision, a shift in alignment between the CF layer and the white light OLED will lead to cross color of emitting lights of a Micro-OLED display device, thereby limiting further improvement of PPI of a Micro-OLED display device.

In view of this, the existing Micro-OLED display module and its manufacturing method actually need to be improved, to solve the above problems.

BRIEF SUMMARY OF THE INVENTION

An object of the present invention is to provide a method for manufacturing a high-resolution Micro-OLED. In the method, through controlling the manufacturing technique and structure of a sub-pixel unit, pixel display density of a Micro-OLED display module manufactured by the method for manufacturing a high-resolution Micro-OLED in the present invention is effectively improved.

In order to achieve the above object of the present invention, the present invention provides a method for manufacturing a high-resolution Micro-OLED, including the following steps:

S1, providing a substrate, and manufacturing light-emitting pixel units on the substrate;

S2, encapsulating the light-emitting pixel units by a film encapsulation technique, and forming a film encapsulation layer;

S3, manufacturing sub-pixel units on the surface of the film encapsulation layer, and depositing a metal reflective layer between two sub-pixel units which are adjacent to each other;

S4, manufacturing a metal oxide layer on the surfaces of the metal reflective layer and the sub-pixel units by a deposition technique, to obtain a high-resolution Micro-OLED matrix; and S5, using a cover plate to encapsulate the high-resolution Micro-OLED matrix produced in step S4, to obtain a high-resolution Micro-OLED.

As a further improvement of the present invention, step S1 specifically includes:

S11, providing a substrate, and manufacturing on the substrate a number of conductive through-holes which are arranged regularly;

S12, evaporating an anode layer on the substrate by a self-aligning process, wherein the anode layer includes a number of anode units, and the anode units are set to be in one-to-one correspondence with the conductive through-holes;

S13, evaporating an OLED light-emitting layer on the surface of the anode layer, wherein the OLED light-emitting layer is a blue light OLED light-emitting layer; and S14, evaporating a cathode layer on the surface of the OLED light-emitting layer, to form light-emitting pixel units.

As a further improvement of the present invention, the anode unit has a width of 5-10 μm.

As a further improvement of the present invention, step S3 is specifically as follows:

S31, manufacturing sub-pixel units on the surface of the film encapsulation layer by a photolithographic process and a reactive ion etching process;

S32, manufacturing a metal reflective layer between two sub-pixel units which are adjacent to each other by a photolithographic process and an etching process; and S33, printing to form quantum dot filter structures inside the sub-pixel units by an electrofluid printing technique.

As a further improvement of the present invention, the spacing between two sub-pixel units which are adjacent to each other is 8-15 μm, and the metal reflective layer is an Al reflective layer.

As a further improvement of the present invention, the quantum dot filter structures include a red quantum dot filter structure and a green quantum dot filter structure, the red quantum dot filter structure and the green quantum dot filter structure are respectively arranged in different sub-pixel units, and the quantum dot filter structures in two adjacent sub-pixel units are different.

As a further improvement of the present invention, the metal oxide layer is obtained through deposition by an atomic deposition technique.

As a further improvement of the present invention, the metal oxide layer is an $Al_2O_3$ layer, and the thickness of the $Al_2O_3$ layer is 50 nm.

In order to achieve the above object of the present invention, the present invention provides a high-resolution Micro-OLED display module which includes a high-resolution Micro-OLED layer and a thin film transistor array electrically connected with the high-resolution Micro-OLED layer, and the high-resolution Micro-OLED layer is manufactured by the method for manufacturing a high-resolution Micro-OLED according to any one of claims 1-8.

As a further improvement of the present invention, the high-resolution Micro-OLED layer includes a substrate and light-emitting pixel units arranged on the substrate, wherein the substrate is provided with a number of conductive through-holes which are arranged regularly, and the thin film transistor array is electrically connected with the light-emitting pixel units via the conductive through-holes.

The present invention has the following beneficial effects: in the method for manufacturing the high-resolution Micro-OLED of the present invention, light-emitting pixel units are manufactured by a photolithographic process and a self-aligning principle, thereby breaking through the physical limit of evaporation of pixel graphics in the prior art, and realizing high pixel density display of a high-resolution Micro-OLED display module; meanwhile, the form of a sub-pixel unit is set, thereby improving color purity of color display of a high-resolution Micro-OLED display module on the one hand, and effectively preventing crosstalk of emitting light between pixels on the other hand, such that the high-resolution Micro-OLED display module manufactured by a method for manufacturing a high-resolution Micro-OLED in the present invention has a higher display resolution.

DETAILED DESCRIPTION OF THE INVENTION

In order to make the objective, technical solutions and advantages of the present invention clearer, a detailed description will be given below on the present invention in combination with accompanying drawings and specific embodiments.

Figure 1:
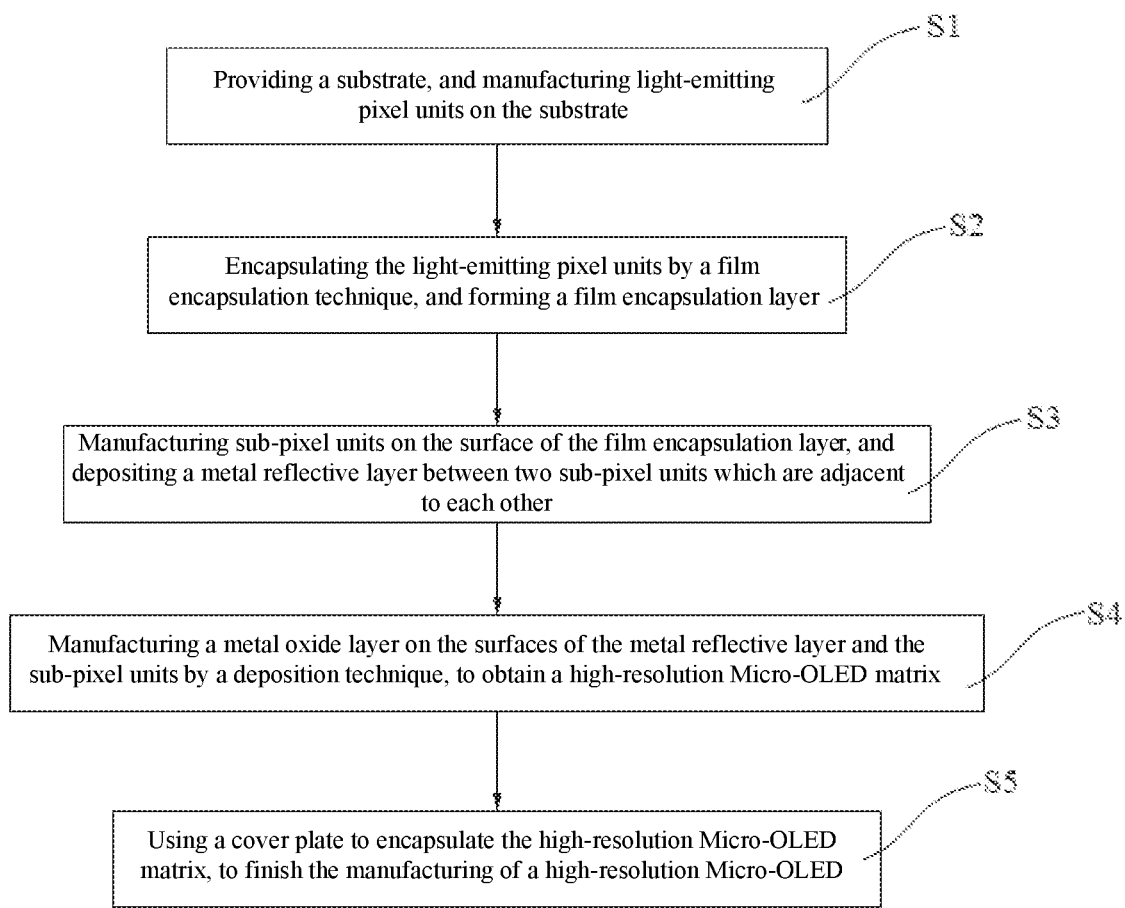
FIG. 1 is a flow chart of a method for manufacturing a high-resolution Micro-OLED in the present invention.
Figure 2:
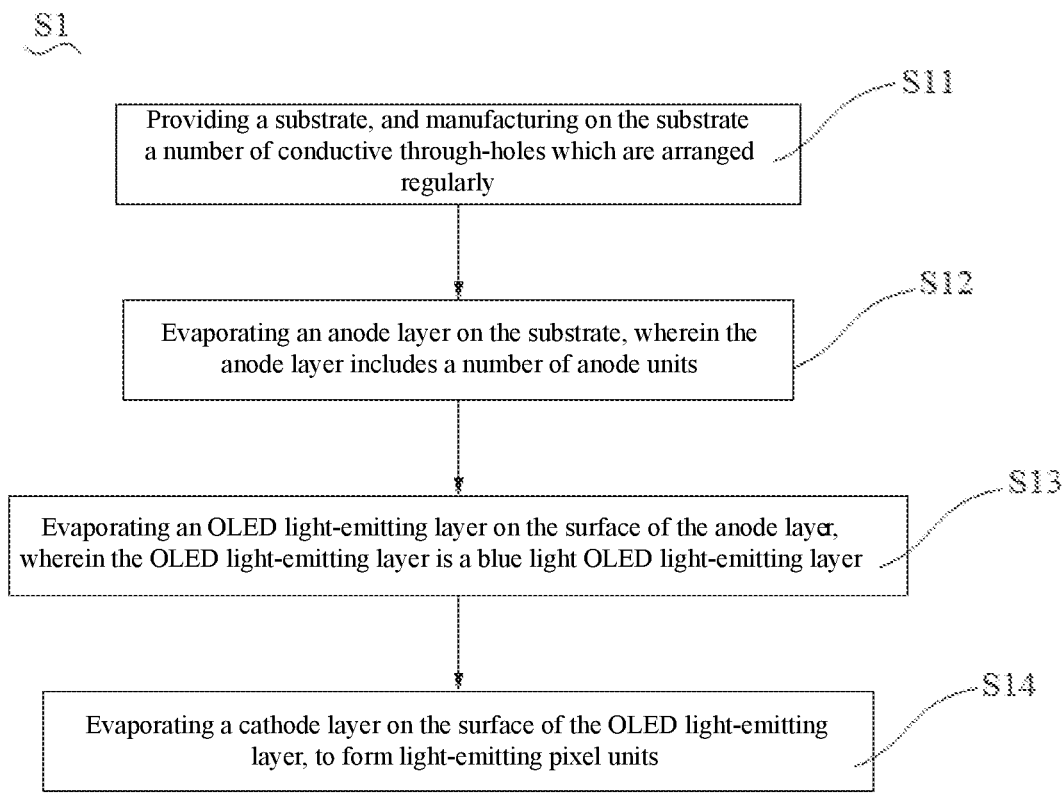
FIG. 2 is a flow chart of step S1 in FIG. 1.
Figure 4:
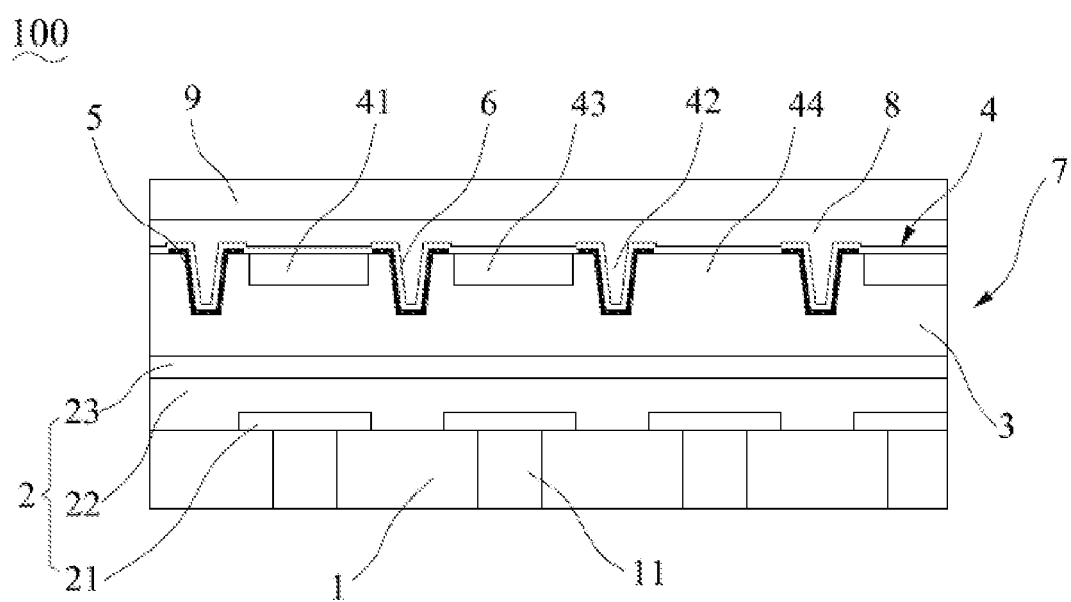
FIG. 4 is a structural schematic diagram of a high-resolution Micro-OLED display module in the present invention.

Please refer to FIG. 1 which is a flow chart of a method for manufacturing a high-resolution Micro-OLED in the present invention and combine with FIG. 4. The method for manufacturing a high-resolution Micro-OLED includes the following steps:

S1, providing a substrate 1, and manufacturing light-emitting pixel units 2 on the substrate 1;

S2, encapsulating the light-emitting pixel units 2 by a film encapsulation technique, and forming a film encapsulation layer 3;

S3, manufacturing sub-pixel units 4 on the surface of the film encapsulation layer 3, and depositing a metal reflective layer 5 between two sub-pixel units 4 which are adjacent to each other;

S4, manufacturing a metal oxide layer 6 on the surfaces of the metal reflective layer 5 and the sub-pixel units 4 by a deposition technique, to obtain a high-resolution Micro-OLED matrix 7; and S5, using a cover plate to encapsulate the high-resolution Micro-OLED matrix 7 produced in step S4, to obtain a high-resolution Micro-OLED.

Steps S1-S5 will be described in detail below in the following description.

Please refer to FIG. 1, and step S1 specifically includes:

S11, providing a substrate 1, and manufacturing on the substrate 1 a number of conductive through-holes 11 which are arranged regularly;

S12, evaporating an anode layer 21 on the substrate 1 by a self-aligning process, wherein the anode layer 21 includes a number of anode units, and the anode units are set to be in one-to-one correspondence with the conductive through-holes 11;

S13, evaporating an OLED light-emitting layer 22 on the surface of the anode layer 21, wherein the OLED light-emitting layer 22 is a blue light OLED light-emitting layer; and S14, evaporating a cathode layer 23 on the surface of the OLED light-emitting layer 22, to form light-emitting pixel units 2.

In the present invention, the substrate 1 includes multiple light-emitting pixel units 2, and two adjacent light-emitting pixel units 2 are set at intervals, moreover, in one preferred embodiment of the present invention, the spacing between two adjacent light-emitting pixel units 2 is 24 μm.

An anode layer 21 is formed by a plurality of anode units which are distributed in a pixel pattern, and each anode unit includes an ITO layer and a metal oxide conductor layer. Moreover, in the embodiment of the present invention, each anode unit has a width of about 5-10 μm. An OLED light-emitting layer 22 includes an organic light-emitting layer, a hole injection layer and a hole transporting layer arranged between the anode layer 21 and/or the substrate 1 and the organic light-emitting layer, and an electron injection layer and an electron transporting layer arranged between the cathode layer 23 and the organic light-emitting layer. Further, the hole transporting layer is arranged between the organic light-emitting layer and the hole injection layer, and the electron transporting layer is arranged between the organic light-emitting layer and the electron injection layer. The cathode layer 23 is a thin film layer made from metal or metal oxide materials.

In step S2, all the light-emitting pixel units 2 on the substrate 1 are encapsulated by a film encapsulation technique, and a film encapsulation layer 3 wrapped on the light-emitting pixel units 2 is formed.

Figure 3:
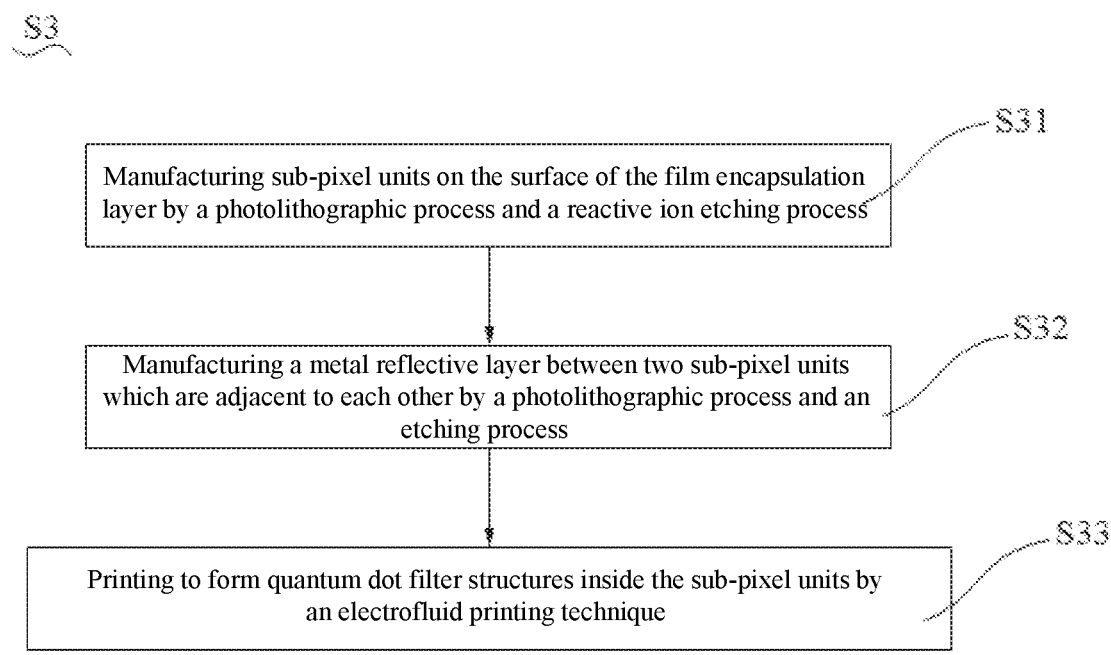
FIG. 3 is a flow chart of step S3 in FIG. 1.

Please refer to FIG. 3, and step S3 specifically includes:

S31, manufacturing sub-pixel units 4 on the surface of the film encapsulation layer 3 by a photolithographic process and a reactive ion etching process;

S32, manufacturing a metal reflective layer 5 between two sub-pixel units 4 which are adjacent to each other by a photolithographic process and an etching process; and S33, printing to form quantum dot filter structures 41 inside the sub-pixel units 4 by an electrofluid printing technique.

In the present invention, the sub-pixel units 4 and the light-emitting pixel units 2 are set correspondingly, and each light-emitting pixel unit 2 corresponds to a plurality of sub-pixel units 4 which are arranged regularly, further, in the same light-emitting pixel unit 2, a separation groove 42 is formed between two adjacent sub-pixel units 4 through a photolithographic process and a reactive ion etching process, such that two adjacent sub-pixel units 4 are set at intervals, and in the embodiment of the present invention, the spacing between two adjacent sub-pixel units 4 is 8-15 μm.

In step S32, a metal layer is firstly deposited on the surface of a film encapsulation layer 3 processed through a photolithographic process and a reactive ion etching process, and then the metal layer is processed by a photolithographic process and an etching process, to manufacture a metal reflective layer 5 in the separation groove 42. Specifically speaking, since the metal reflective layer 5 is set to be close to the sub-pixel units 4 and is arranged between two adjacent sub-pixel units 4, therefore, external ambient light can be effectively reflected, and crosstalk of emitting light is prevented. Preferably, in one embodiment of the present invention, the metal reflective layer 5 is an Al reflective layer made from metallic aluminum.

Further, the quantum dot filter structures 41 include a red quantum dot filter structure and a green quantum dot filter structure, wherein the red quantum dot filter structure and the green quantum dot filter structure are respectively arranged in different sub-pixel units 4, and the quantum dot filter structures 41 in two adjacent sub-pixel units 4 are different.

Specifically speaking, in the embodiment of the present invention, the sub-pixel units 4 include a first sub-pixel unit 43 with a groove arranged on the top part and a second sub-pixel unit 44 with the top part being arranged horizontally, the red quantum dot filter structure and the green quantum dot filter structure are respectively printed in two adjacent first sub-pixel units 43, and the two adjacent first sub-pixel units 43 with different quantum dot filer structures 41 are arranged between two second sub-pixel units 44. The red quantum dot and the green quantum dot in the red quantum dot filter structure and the green quantum dot filter structure respectively emit a red light and a green light after being excited by a blue light emitted by the OLED light-emitting layer 22, and the red light and green light are mixed with the blue light which penetrates through the second sub-pixel unit 44 to form a white light. Since the light-emitting purity of the quantum dot is high, and colors can be controlled through a diameter of the quantum dot, therefore, the color gamut and display quality of a high-resolution Micro-OLED can be effectively improved.

Step S4 is specifically as follows: a metal oxide layer 6 is manufactured on surfaces of the metal reflective layer 5 and the sub-pixel units 4 by a deposition technique, to obtain a high-resolution Micro-OLED matrix 7; in the embodiment of the present invention, the metal oxide layer 6 is obtained through deposition by an atomic deposition technique, preferably, the metal oxide layer 6 is an $Al_2O_3$ layer, and the thickness of the $Al_2O_3$ layer is 50 nm.

Step S5 is specifically as follows: a cover plate is used to encapsulate a high-resolution Micro-OLED matrix 7 produced in step S4 by UV adhesive 8 and encapsulating glass 9, at this time, the manufacturing of a high-resolution Micro-OLED is finished, wherein the UV adhesive 8 is arranged between the encapsulating glass 9 and the high-resolution Micro-OLED matrix 7, such that the encapsulating glass 9 is closely attached onto the high-resolution Micro-OLED matrix 7, to realize encapsulation by using a cover plate.

Please refer to FIG. 4 which shows a high-resolution Micro-OLED display module provided in the present invention. The high-resolution Micro-OLED display module includes a high-resolution Micro-OLED layer 100 and a thin film transistor array (not shown in the figure) electrically connected with the high-resolution Micro-OLED layer 100. Further, the high-resolution Micro-OLED layer 100 is manufactured by the above method for manufacturing a high-resolution Micro-OLED.

Further, in the present invention, a high-resolution Micro-OLED layer 100 includes a substrate 1 and light-emitting pixel units 2 arranged on the substrate 1, wherein the substrate 1 is provided with a number of conductive through-holes 11 which are arranged regularly, the thin film transistor array includes a thin film transistor configured to drive the light-emitting pixel units 2 to emit light, and the light-emitting pixel units 2 are electrically connected with the thin film transistor via the conductive through-holes.

In summary, in the method for manufacturing the high-resolution Micro-OLED of the present invention, light-emitting pixel units 2 are manufactured by a photolithographic process and a self-aligning principle, thereby breaking through the physical limit of evaporation of pixel graphics in the prior art, and realizing high pixel density display of a high-resolution Micro-OLED display module; meanwhile, the form of a sub-pixel unit 4 is set, thereby improving color purity of color display of a high-resolution Micro-OLED display module 100 on the one hand, and effectively preventing crosstalk of emitting light between sub-pixel units 4 on the other hand, such that the high-resolution Micro-OLED display module manufactured by a method for manufacturing a high-resolution Micro-OLED in the present invention has a higher display resolution.

The above embodiments are merely for illustrating rather than for limiting technical solutions of the present invention. Although the present invention has been described in detail with reference to preferred embodiments, those skilled in the art should understand that modifications or equivalent substitutions can be made to the technical solutions of the present invention without departing from the spirit and scope of the technical solutions of the present invention.

The invention claimed is:

1. A method for manufacturing a high-resolution Micro-OLED, comprising:
    S1, providing a substrate, and manufacturing light-emitting pixel units on the substrate;
    S2, encapsulating the light-emitting pixel units by a film encapsulation technique, and forming a film encapsulation layer;
    S3, manufacturing sub-pixel units on a surface of the film encapsulation layer, and depositing a metal reflective layer between two sub-pixel units which are adjacent to each other;
    S4, manufacturing a metal oxide layer on surfaces of the metal reflective layer and the sub-pixel units by a deposition technique, to obtain a high-resolution Micro-OLED matrix; and
    S5, using a cover plate to encapsulate the high-resolution Micro-OLED matrix produced in step S4, to obtain a high-resolution Micro-OLED,
    wherein step S1 comprises:
    S11, providing a substrate, and manufacturing on the substrate a number of conductive through-holes which are arranged regularly;
    S12, evaporating an anode layer on the substrate by a self-aligning process, wherein the anode layer comprises a number of anode units, and the anode units are set to be in one-to-one correspondence with the conductive through-holes;
    S13, evaporating an OLED light-emitting layer on the surface of the anode layer, wherein the OLED light-emitting layer is a blue light OLED light-emitting layer; and
    S14, evaporating a cathode layer on the surface of the OLED light-emitting layer, to form light-emitting pixel units.

2. The method for manufacturing a high-resolution Micro-OLED according to claim 1, wherein the anode unit has a width of 5-10 μm.

3. The method for manufacturing a high-resolution Micro-OLED according to claim 1, wherein step S3 is specifically as follows:
  S31, manufacturing sub-pixel units on the surface of the film encapsulation layer by a photolithographic process and a reactive ion etching process;
  S32, manufacturing a metal reflective layer between two sub-pixel units which are adjacent to each other by a photolithographic process and an etching process; and
  S33, printing to form quantum dot filter structures inside the sub-pixel units by an electrofluid printing technique.

4. The method for manufacturing a high-resolution Micro-OLED according to claim 3, wherein a spacing between two sub-pixel units which are adjacent to each other is 8-15 μm, and the metal reflective layer is an Al reflective layer.

5. The method for manufacturing a high-resolution Micro-OLED according to claim 3, wherein the quantum dot filter structures include a red quantum dot filter structure and a green quantum dot filter structure, the red quantum dot filter structure and the green quantum dot filter structure are respectively arranged in different sub-pixel units, and the quantum dot filter structures in two adjacent sub-pixel units are different.

6. The method for manufacturing a high-resolution Micro-OLED according to claim 1, wherein the metal oxide layer is obtained through deposition by an atomic deposition technique.

7. The method for manufacturing a high-resolution Micro-OLED according to claim 6, wherein the metal oxide layer is an $Al_2O_3$ layer, and a thickness of the $Al_2O_3$ layer is 50 nm.

8. A high-resolution Micro-OLED display module, comprising a high-resolution Micro-OLED layer and a thin film transistor array electrically connected with the high-resolution Micro-OLED layer, wherein the high-resolution Micro-OLED layer is manufactured by the method for manufacturing a high-resolution Micro-OLED according to claim 1, wherein the high-resolution Micro-OLED layer comprises a substrate and light-emitting pixel units arranged on the substrate, the substrate is provided with a number of conductive through-holes which are arranged regularly, and the thin film transistor array is electrically connected with the light-emitting pixel units via the conductive through-holes.

9. The high-resolution Micro-OLED display module according to claim 8, wherein the anode unit has a width of 5-10 μm.

10. The high-resolution Micro-OLED display module according to claim 8, wherein the sub-pixel units comprises:
  a metal reflective layer between two sub-pixel units which are adjacent to each other; and
  quantum dot filter structures inside the sub-pixel units, wherein the quantum dot filter structures include a red quantum dot filter structure and a green quantum dot filter structure, the red quantum dot filter structure and the green quantum dot filter structure are respectively arranged in different sub-pixel units, and the quantum dot filter structures in two adjacent sub-pixel units are different.

11. The high-resolution Micro-OLED display module according to claim 8, wherein the metal oxide layer is obtained through deposition by an atomic deposition technique.

12. The high-resolution Micro-OLED display module according to claim 11, wherein the metal oxide layer is an $Al_2O_3$ layer, and a thickness of the $Al_2O_3$ layer is 50 nm.

13. A method for manufacturing a high-resolution Micro-OLED, comprising:
  S1, providing a substrate, and manufacturing light-emitting pixel units on the substrate;
  S2, encapsulating the light-emitting pixel units by a film encapsulation technique, and forming a film encapsulation layer;
  S3, manufacturing sub-pixel units on a surface of the film encapsulation layer, and depositing a metal reflective layer between two sub-pixel units which are adjacent to each other;
  S4, manufacturing a metal oxide layer on surfaces of the metal reflective layer and the sub-pixel units by a deposition technique, to obtain a high-resolution Micro-OLED matrix; and
  S5, using a cover plate to encapsulate the high-resolution Micro-OLED matrix produced in step S4, to obtain a high-resolution Micro-OLED,
  wherein step S3 is specifically as follows:
  S31, manufacturing sub-pixel units on the surface of the film encapsulation layer by a photolithographic process and a reactive ion etching process;
  S32, manufacturing a metal reflective layer between two sub-pixel units which are adjacent to each other by a photolithographic process and an etching process; and
  S33, printing to form quantum dot filter structures inside the sub-pixel units by an electrofluid printing technique.

14. The method for manufacturing a high-resolution Micro-OLED according to claim 13, wherein a spacing between two sub-pixel units which are adjacent to each other is 8-15 μm, and the metal reflective layer is an Al reflective layer.

15. The method for manufacturing a high-resolution Micro-OLED according to claim 13, wherein the quantum dot filter structures include a red quantum dot filter structure and a green quantum dot filter structure, the red quantum dot filter structure and the green quantum dot filter structure are respectively arranged in different sub-pixel units, and the quantum dot filter structures in two adjacent sub-pixel units are different.

16. The method for manufacturing a high-resolution Micro-OLED according to claim 13, wherein the metal oxide layer is obtained through deposition by an atomic deposition technique.

17. The method for manufacturing a high-resolution Micro-OLED according to claim 16, wherein the metal oxide layer is an $Al_2O_3$ layer, and a thickness of the $Al_2O_3$ layer is 50 nm.

\* \* \* \* \*